(12) United States Patent
Wen et al.

(10) Patent No.: US 9,275,905 B1
(45) Date of Patent: Mar. 1, 2016

(54) METHOD OF FORMING SEMICONDUCTOR STRUCTURE WITH ANTI-PUNCH THROUGH STRUCTURE

(71) Applicant: TAIWAN SEMICONDUCTOR MANUFACTURING CO., LTD., Hsin-Chu (TW)

(72) Inventors: Tsung-Yao Wen, Hsinchu (TW); Jui-Yao Lai, Yuanlin Township, Changhwa County (TW); Yao-De Chiou, Taoyuan (TW); Sai-Hooi Yeong, Zhubei (TW); Yen-Ming Chen, Chu-Pei (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/607,780

(22) Filed: Jan. 28, 2015

(51) Int. Cl.
| | | |
|---|---|---|
| *H01L 21/337* | (2006.01) | |
| *H01L 21/8249* | (2006.01) | |
| *H01L 21/8238* | (2006.01) | |
| H01L 27/088 | (2006.01) | |
| H01L 21/8234 | (2006.01) | |
| H01L 29/66 | (2006.01) | |
| H01L 29/78 | (2006.01) | |

(52) U.S. Cl.
CPC . *H01L 21/823807* (2013.01); *H01L 21/823431* (2013.01); *H01L 21/823821* (2013.01); *H01L 27/0886* (2013.01); *H01L 29/66795* (2013.01); *H01L 29/785* (2013.01)

(58) Field of Classification Search
USPC .......... 438/192, 194, 217, 218; 257/288, 327, 257/329, 618
See application file for complete search history.

(56) References Cited

U.S. PATENT DOCUMENTS

| | | | |
|---|---|---|---|
| 8,497,171 B1 | 7/2013 | Wu et al. | |
| 2006/0170060 A1 | 8/2006 | Wu et al. | |
| 2007/0148926 A1* | 6/2007 | Datta ................ | H01L 21/26586 438/510 |
| 2007/0235763 A1* | 10/2007 | Doyle ............... | H01L 29/78687 257/202 |
| 2008/0001171 A1* | 1/2008 | Tezuka ............ | H01L 21/823807 257/191 |
| 2012/0319211 A1 | 12/2012 | van Dal et al. | |
| 2013/0161689 A1 | 6/2013 | Huo et al. | |
| 2014/0054679 A1* | 2/2014 | Tang ................. | H01L 21/26586 257/329 |
| 2014/0227846 A1 | 8/2014 | Liaw | |
| 2015/0044829 A1* | 2/2015 | Kim ................ | H01L 21/823807 438/199 |

* cited by examiner

*Primary Examiner* — Karen Kusumakar
(74) *Attorney, Agent, or Firm* — Birch, Stewart, Kolasch & Birch, LLP

(57) ABSTRACT

A method for manufacturing a semiconductor structure is provided. The method includes implanting a first type of dopants in a first region and a second region and implanting a second type of dopants in the second region. In addition, an un-doped silicon layer is formed over the first and second regions, and a first and a second fin structures are formed. The first fin structure includes a first type of anti-punch through structure implanted with the first type of dopants and a first un-doped silicon structure over the first type of anti-punch through structure, and the second fin structure includes a second type of anti-punch through structure implanted with the second type of dopants and a second un-doped silicon structure formed over the second type of anti-punch through structure.

20 Claims, 12 Drawing Sheets

METHOD OF FORMING SEMICONDUCTOR STRUCTURE WITH ANTI-PUNCH THROUGH STRUCTURE

CROSS REFERENCE TO RELATED APPLICATIONS

This application is related to the co-pending and commonly assigned application Ser. No. 14/607,971, filed on Jan. 28, 2015 and entitled "BARRIER LAYER ABOVE ANTI-PUNCH THROUGH (APT) IMPLANT REGION TO IMPROVE MOBILITY OF CHANNEL REGION OF FIN FIELD EFFECT TRANSISTOR (FINFET) DEVICE STRUCTURE", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in computers is the higher levels of integration of circuits. This is accomplished by miniaturizing or shrinking device sizes on a given chip. Tolerances play an important role in being able to shrink dimensions on a chip.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
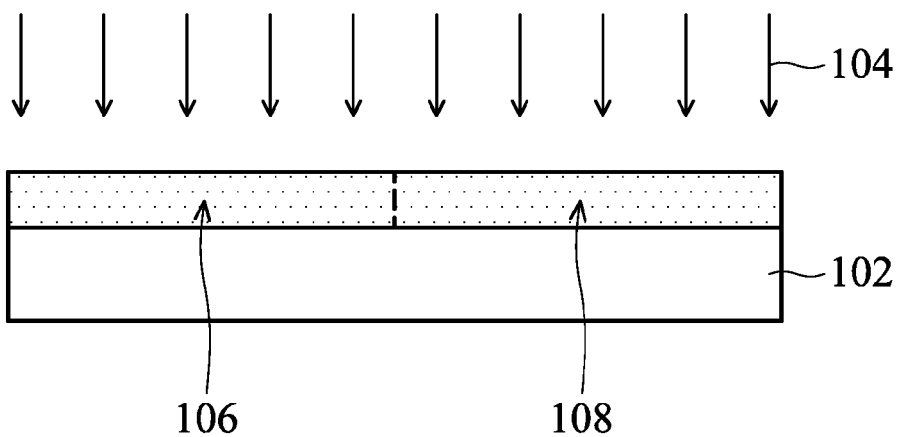
FIGS. 1A to 1K are cross-sectional representations of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for forming the same are provided in accordance with some embodiments of the disclosure. The semiconductor structure may include an anti-punch through (APT) structure formed right below the channel of a fin structure to improve the performance of the semiconductor structure.

FIGS. 1A to 1K are cross-sectional representations of various stages of forming a semiconductor structure 100a in accordance with some embodiments. As shown in FIG. 1A, a substrate 102 is provided in accordance with some embodiments. In some embodiments, substrate 102 is a silicon substrate. In some embodiments, substrate 102 is a silicon-on-insulator (SOI) substrate.

A first type of dopants are implanted in the top portion of substrate 102, as shown in FIG. 1A in accordance with some embodiments. More specifically, a first ion implantation process 104 is performed to substrate 102 to implant the first type of dopants in a first region 106 and a second region 108 of substrate 102 in accordance with some embodiments. In some embodiments, the first type of dopants are n-type dopants, such as B, $BF_2$, or the like. In some embodiments, the first type of dopants are p-type dopants, such as P, As, or the like.

In some embodiments, the first type of dopants are implanted in substrate 102 to a depth in a range from about 5 nm to about 10 nm, which is measure from the top surface of substrate 102. If the first type of dopants are implanted to a position that is too deep (i.e. too far from the top surface of substrate 102), the resulting first type of anti-punch through structure may also be too far away from the channel region of the fin structure, such that the effect of the anti-punch through structure may be undermined. On the other hand, if the first type of dopants are implanted to a position that is too shallow (i.e. too close to the top surface of substrate 102), the dopants in the first type of anti-punch through structure may enter the channel region of the fin structure in subsequent thermal processes, such that the electron mobility in the channel region may be affected. The details will be described later.

Figure 1B:
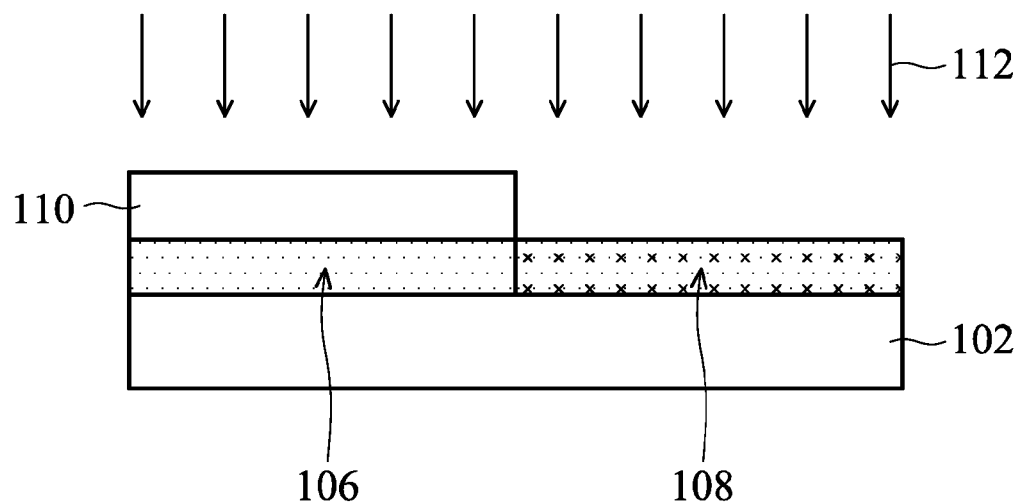

After the first type of dopants are implanted in first region 106 and second region 108 of substrate 102, a photoresist layer 110 is formed over first region 106, such that first region 106 is covered by photoresist layer 110 while second region 108 is exposed, as shown in FIG. 1B in accordance with some embodiments.

After photoresist layer 110 is formed, as second type of dopants are implanted in the exposed second region 108, and photoresist layer 110 is removed afterwards, as shown in FIG.

1B in accordance with some embodiments. In some embodiments, a second ion implantation process 112 is performed to implant the second type of dopants into second region 108 of substrate 102. In some embodiments, the second type of dopants are n-type dopants, such as B, $BF_2$, or the like. In some embodiments, the second type of dopants are p-type dopants, such as P, As, or the like.

In some embodiments, the second type of dopants are implanted in substrate 102 to a depth in a range from about 5 nm to about 10 nm. Similarly, if the second type of dopants are implanted to a position that is too deep, the resulting second type of anti-punch through structure may be formed away from the channel region of the fin structure, such that the effect of the anti-punch through structure may be undermined. On the other hand, if the second type of dopants are implanted to a position that is too shallow, the dopants in the second type of anti-punch through structure may enter the channel region of the fin structure in subsequent thermal processes, such that the electron mobility in the channel region may be affected.

Figure 1C:
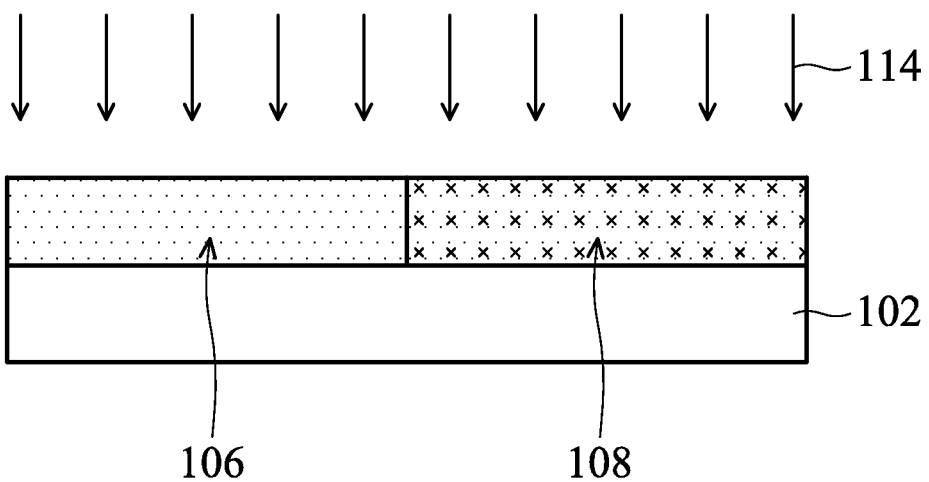
Figure 1D:
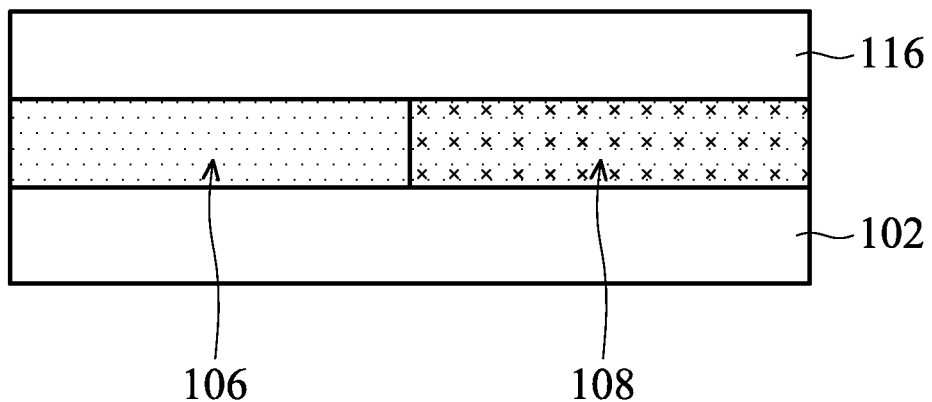

After the first type of dopants and the second type of dopants are both implanted in substrate 102, an annealing process 114 is performed, as shown in FIG. 1C in accordance with some embodiments. During annealing process 114, the first type of dopants and the second type of dopants are annealed, such that the first type of dopants and the second type of dopants are redistributed in first region 106 and second region 108 of substrate 102.

Accordingly, after annealing process 114, the first type of dopants and the second type of dopants are redistributed, such that the dopants are concentrated at a depth in a range from about 10 nm to about 20 nm, which is measured from the top surface of substrate 102. The location of the dopants are designed to be close enough to the channel region of the structure formed in subsequent processes but not to be too close to effect the electron mobility in the channel region.

In some embodiments, annealing process 114 is performed at a temperature in a range from about 700° C. to about 1000° C. The annealing temperature may be relatively low.

The first type of dopants and the second type of dopants may he different types of dopants. For example, the first type of dopants are n-type dopants and the second type of dopants are p-type dopants, or the first type of dopants are p-type dopants and the second type of dopants are n-type dopants. In some embodiments, the doping concentration of the second type of dopants implanted in second region 108 is substantially twice of the doping concentration of the first type of dopants implanted in second region 108. Accordingly, the first type of dopants implanted in second region 108 during first ion implantation process 104 can be counterbalanced by the second type of dopants implanted during second ion implantation process 112. As a result, first region 106 can be seen as a first-type doping region, and second region 108 can be seen as a second type doping region.

Next, an up-doped silicon layer 116 is formed over first region 106 and second region 108 of substrate 102, as shown in FIG. 1C in accordance with some embodiments. Un-doped silicon layer 116 is formed by an epitaxial (epi) process in accordance with some embodiments. Since the first type of dopants and the second type of dopants are implanted and annealed before un-doped silicon layer 116 is formed, no dopants are implanted in un-doped silicon layer 116. Accordingly, the electron mobility of the channel region formed from un-doped silicon layer 116 is improved.

In some embodiments, the thickness of un-doped silicon layer 116 is in a range from about 30 nm to about 60 nm. If un-doped silicon layer 116 is too thick, dislocation may occur during its formation. On the other hand, if un-doped silicon layer 116 is too thin, the channel region of the resulting fin structure may not be large enough.

Figure 1E:
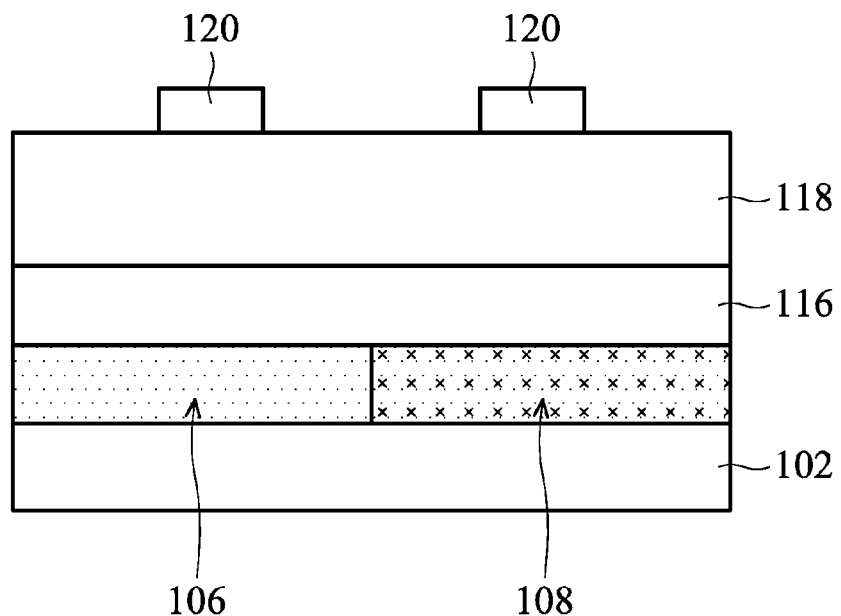

After un-doped silicon layer 116 is formed, a polysilicon layer 118 is formed over un-doped silicon layer 116, as shown in FIG. 1E in accordance with some embodiments. Polysilicon layer 118 may be seen as a sacrificial layer and may be made of other materials. A photoresist layer 120 is formed over polysilicon layer 118 and includes a first portion and a second portion, which are respectively formed over first region 106 and second region 108 of substrate 102.

Figure 1F:
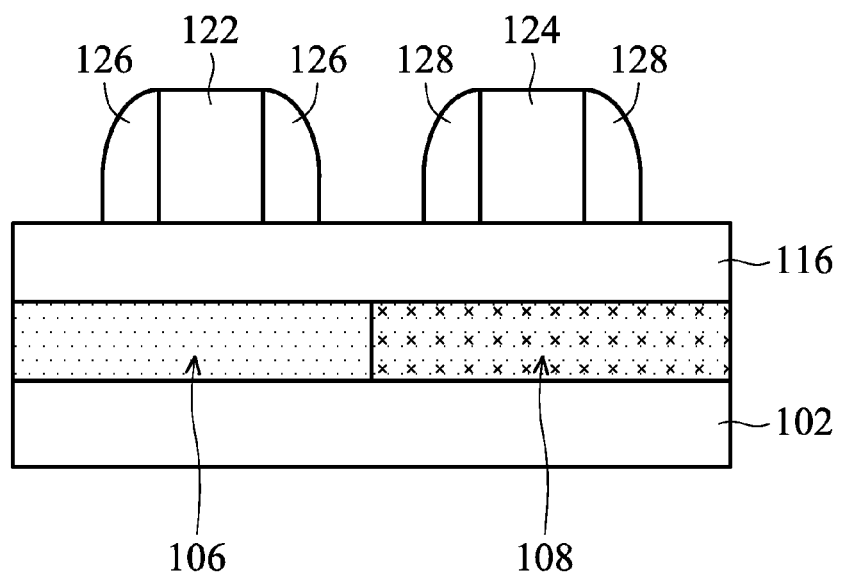

After photoresist layer 120 is formed, polysilicon layer 118 is patterned to form a first polysilicon structure 122 and a second polysilicon structure 124, as shown in FIG. 1F in accordance with some embodiments. In addition, first polysilicon structure 122 is formed over first region 106, and second polysilicon structure 124 is formed over second region 108.

Next, first spacers 126 are formed on the sidewalls of first polysilicon structure 122, and second spacers 128 are formed on the sidewalls of second polysilicon structure 124, as shown in FIG. 1F in accordance with some embodiments. First spacers 126 and second spacers 128 may be made of silicon nitride, silicon oxide, silicon oxynitride, silicon carbide, or other applicable dielectric materials.

Figure 1G:
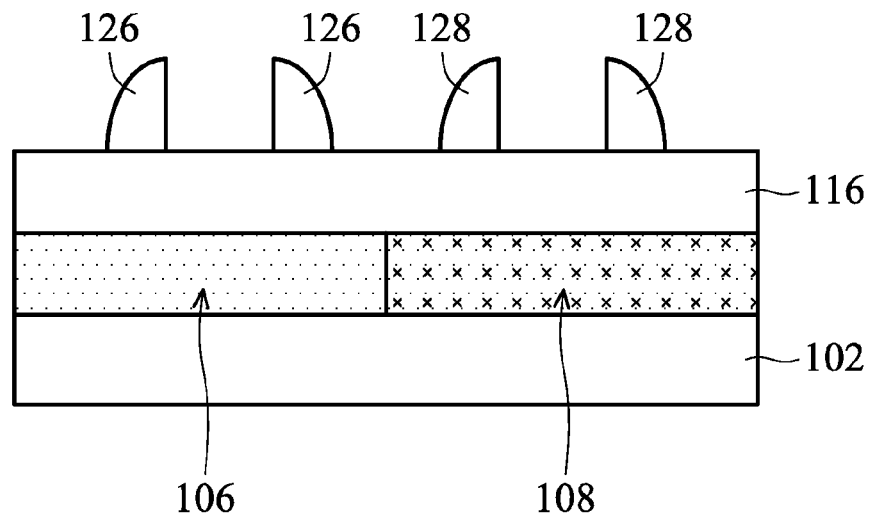

After first spacers 126 and second spacers 128 are formed, first polysilicon structure 122 and second polysilicon structure 124 are removed, as shown in FIG. 1G in accordance with some embodiments. As shown in FIG. 1G, first spacers 126 are positioned over un-doped silicon layer 116 over first region 106 of substrate 102, and second spacers 128 are positioned over un-doped silicon layer 116 over second region 108 of substrate 102.

Figure 1H:
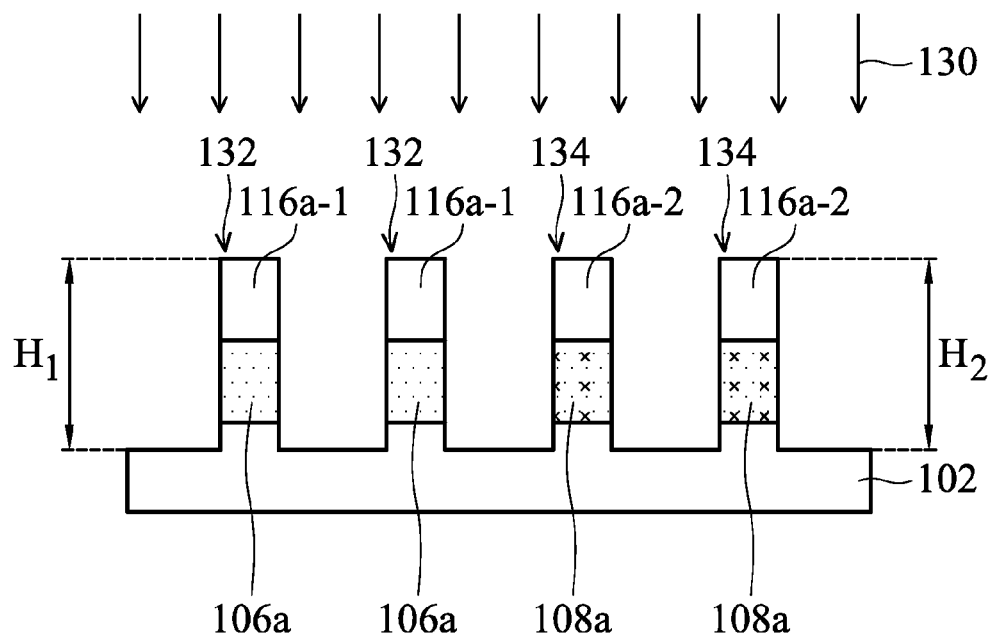

Next, an etching process 130 is performed to etch un-doped silicon layer 116 and substrate 102, and first spacers 126 and second spacers are removed afterwards, as shown in FIG. 1H in accordance with some embodiments. More specifically, first spacers 126 are used as masks for etching a portion of un-doped silicon layer 116 over first region 106 and first region 106 of substrate 102, and second spacers 128 are used as masks for etching another portion of un-doped silicon layer 116 over second region 10 and second region 108 of substrate 102.

After etching process 130 is performed, un-doped silicon layer 116 over first region 106 and first region 106 of substrate 102 are patterned to form first fin structures 132, and un-doped silicon layer 116 over second region 108 and second region 108 of substrate 102 are patterned to form second fin structures 134, as shown in FIG. 1H in accordance with some embodiments.

In some embodiments, each first fin structure 132 has a first height $H_1$ in a range from about 50 nm to 170 nm. If first fin structure 132 is too high, it may tend to bend during subsequent processes. On the other hand, if first fin structure 132 is too short, the shallow trench isolation structure formed afterwards may not have enough thickness.

As shown in FIG. 1H, each first fin structure 132 includes a first type of anti-punch through structure 106a and a first un-doped silicon structure 116a-1 formed over first type of anti-punch through structure 106a in accordance with some embodiments. In addition, first type of anti-punch through structure 106a is formed by patterning first region 106 of substrate 102, and therefore first type of anti-punch through structure 106a is implanted with the first-type of dopants in accordance with some embodiments.

In some embodiments, the thickness of first type of anti-punch through structure 106a is in a range of about 10 nm to about 20 nm. In some embodiments, the thickness of first un-doped silicon structure 116a-1 is in a range from about 30 nm to about 60 nm. If first un-doped silicon structure 116a-1 is not thick enough, the channel region of first fin structure 132 may not be large enough for the semiconductor structure.

Similarly, each second fin structure 134 has a second height $H_2$ substantially equal to first height of first fin structure 132. If second fin structure 134 is too high, it may tend to bend during subsequent processes. On the other hand, if second fin structure 134 is too short, the shallow trench isolation structure formed afterwards may not have enough thickness.

As shown in FIG. 1H, each second fin structure 134 includes a second type of anti-punch through structure 108a and a second un-doped silicon structure 116a-2 formed over second type of anti-punch through structure 108a in accordance with some embodiments. In addition, second type of anti-punch through structure 108a is formed by patterning second region 108 of substrate 102, and therefore second type of anti-punch through structure 108a is implanted with the second-type of dopants in accordance with some embodiments.

In some embodiments, the thickness of second type of anti-punch through structure 108a is substantially equal to the thickness of first type of anti-punch through structure 106a. In some embodiments, the thickness of second un-doped silicon structure 116a-2 is substantially equal to the thickness of the first un-doped silicon structure 116a-1. If second un-doped silicon structure 116a-2 is not thick enough, the channel region of second fin structure 134 may not be large enough for the semiconductor structure.

Figure 1I:
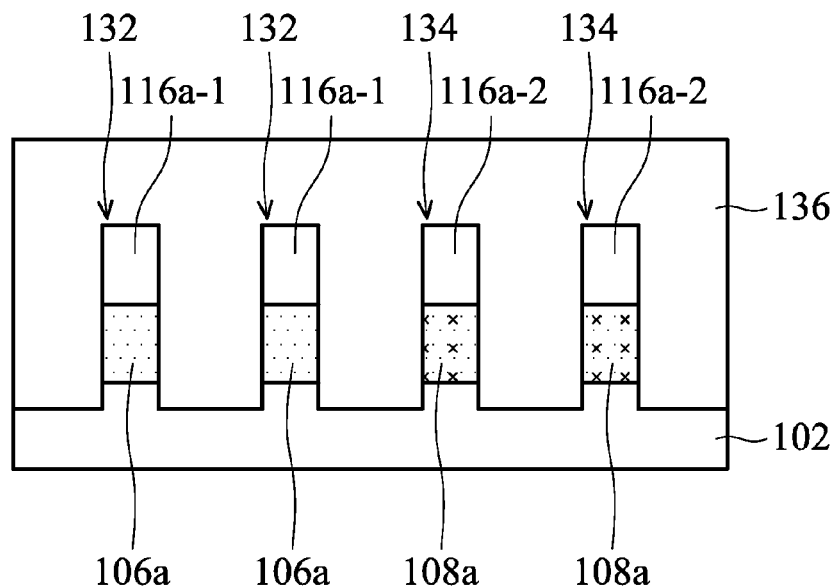

After first fin structures 132 and second fin structure 134 are formed, an insulating layer 136 is formed to cover first fin structures 132 and second fin structure 134 over substrate 102, as shown in FIG. 1I in accordance with some embodiments. In some embodiments, insulating layer 136 is made of silicon oxide. Insulating layer 136 may be formed by using a high-density-plasma (HDP) CVD process, although other deposition processes may be used in other embodiments.

After insulating layer 136 is formed, the upper portion of insulating layer 136 over the top surface of first fin structures 132 and second fin structure 134 is removed to expose the top surface of first fin structures 132 and second fin structure 134. The removal of the upper portion of insulating layer 136 may include performing a chemical mechanical polishing (CMP) process.

Figure 1J:
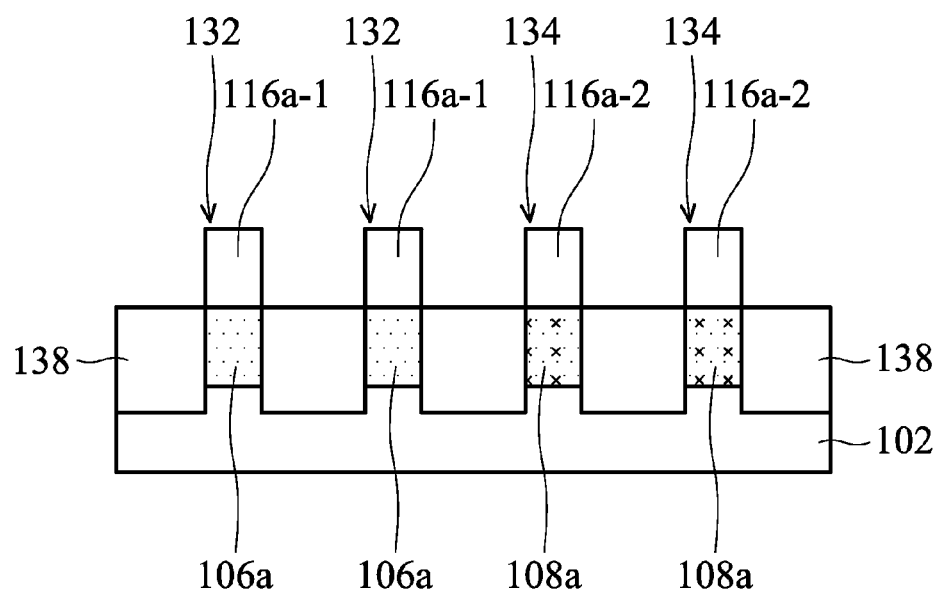

Next, insulating layer 136 is further recessed to form a shallow trench isolation (STI) structure 138 around first fin structures 132 and second fin structure 134, as shown in FIG. 1J in accordance with some embodiments. In some embodiments, the top surface of shallow trench isolation 138 is substantially level with the top surfaces of first-type anti-punch through structure 106a and second-type anti-punch through structure 108a. If the top surface of shallow trench isolation 138 is too much higher than the top surfaces of first-type anti-punch through structure 106a and second-type anti-punch through structure 108a (i.e. too little insulating layer 136 being removed), the channel width of first fin structures 132 and second fin structure 134 may be too small. On the other hand, if the top surface of shallow trench isolation 138 is too much lower than the top surfaces of first-type anti-punch through structure 106a and second-type anti-punch through structure 108a (i.e. too much insulating layer 136 being removed), the gate-control ability may be undermined.

Figure 1K:
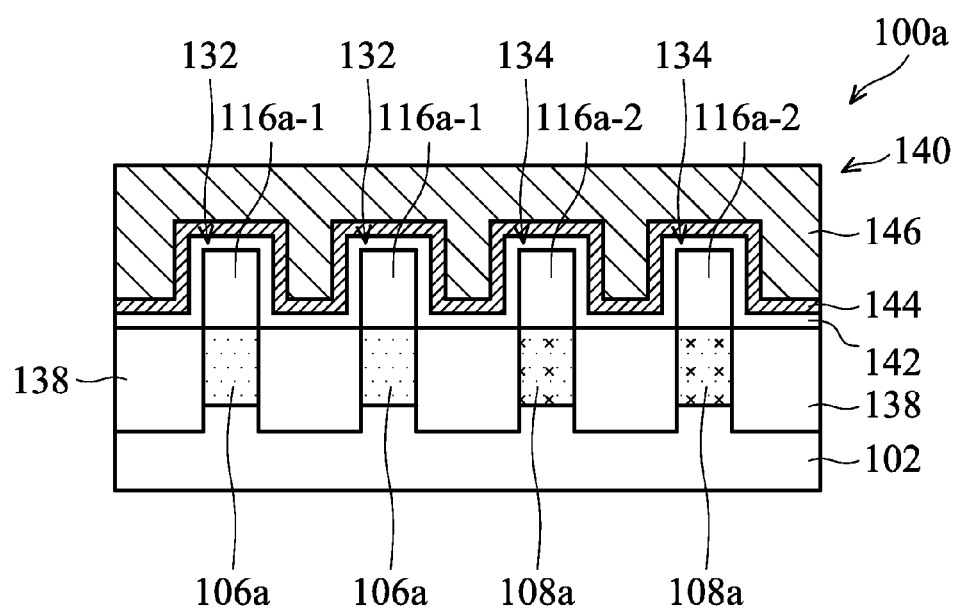

After shallow trench isolation structure 138 is formed, a gate structure 140 is formed across first fin structures 132 and second fin structure 134, as shown in FIG. 1K in accordance with some embodiments. In some embodiments, gate structure 140 includes a gate dielectric layer 142, a work function metal layer 144, and a metal gate electrode layer 146.

In some embodiments, gate structure 140 is made of a gate-last manufacturing process. For example, a dummy gate structure may first be formed across first fin structures 132 and second fin structure 134, and spacers may be formed on the side walls of the dummy gate structure. In addition, source/drain structures may be formed at the opposite sides of the dummy gate structure in first fin structures 132 and second fin structure 134. Next, a contact etch stop layer and an inter-level dielectric layer may be formed over substrate 102 to cover the source/drain structures and shallow trench isolation structure 138 but exposed the top surface of the dummy gate structure. Afterwards, the dummy gate structure may be replaced by gate structure 140.

In some embodiments, gate dielectric layer 142 is made of high k dielectric materials. Examples of the high k dielectric material may include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal oxides, transition metal nitrides, transition metal silicates, oxynitrides of metals, metal aluminates, zirconium silicate, zirconium aluminate, silicon oxide, silicon nitride, silicon oxynitride, zirconium oxide, titanium oxide, aluminum oxide, or hafnium dioxide-alumina ($HfO_2$—$Al_2O_3$) alloy.

Work function metal layer 144 is formed over gate dielectric layer 142 in accordance with some embodiments. Work function metal layer 144 may be customized to have the proper work function. For example, if a P-type work function metal (P-metal) for a PMOS device is desired, TiN, WN, or W may be used. On the other hand, if an N-type work function metal (N-metal) for NMOS devices is desired. TiAl, TiAlN, or TaCN, may be used.

Metal gate electrode layer 146 is formed over work function metal layer 144 in accordance with some embodiments. In some embodiments, metal gate electrode layer 146 is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials. Gate dielectric layer 142, work function metal layer 144, and metal gate electrode layer 146 may be formed by any applicable process to any applicable thickness.

It should be noted that additional layers, such as liner layers, interface layers, seed layers, adhesion layers, barrier layers, or the like, may be formed above and/or below gate dielectric layer 142, work function metal layer 144, and metal gate electrode layer 146. In addition, gate dielectric layer 142, work function metal layer 144, and metal gate electrode layer 146 may be made of one or more materials and/or may include one or more layers.

As shown in FIG. 1K, first un-doped silicon structures 116a-1 and second un-doped silicon structure 116a-2 are covered by gate structure 140 and are configure to be the channel regions of semiconductor structure 100a. In addition, first type of anti-punch through structure 106a and second type of anti-punch through structure 108a are self-aligned to the channel regions (i.e. first un-doped silicon structures 116a-1, second un-doped silicon structure 116a-2) without using complicated aligning processes. It should be noted that, other elements may also be formed in semiconductor structure 100a, although they are not shown in FIGS. 1A to 1K.

Figure 2:
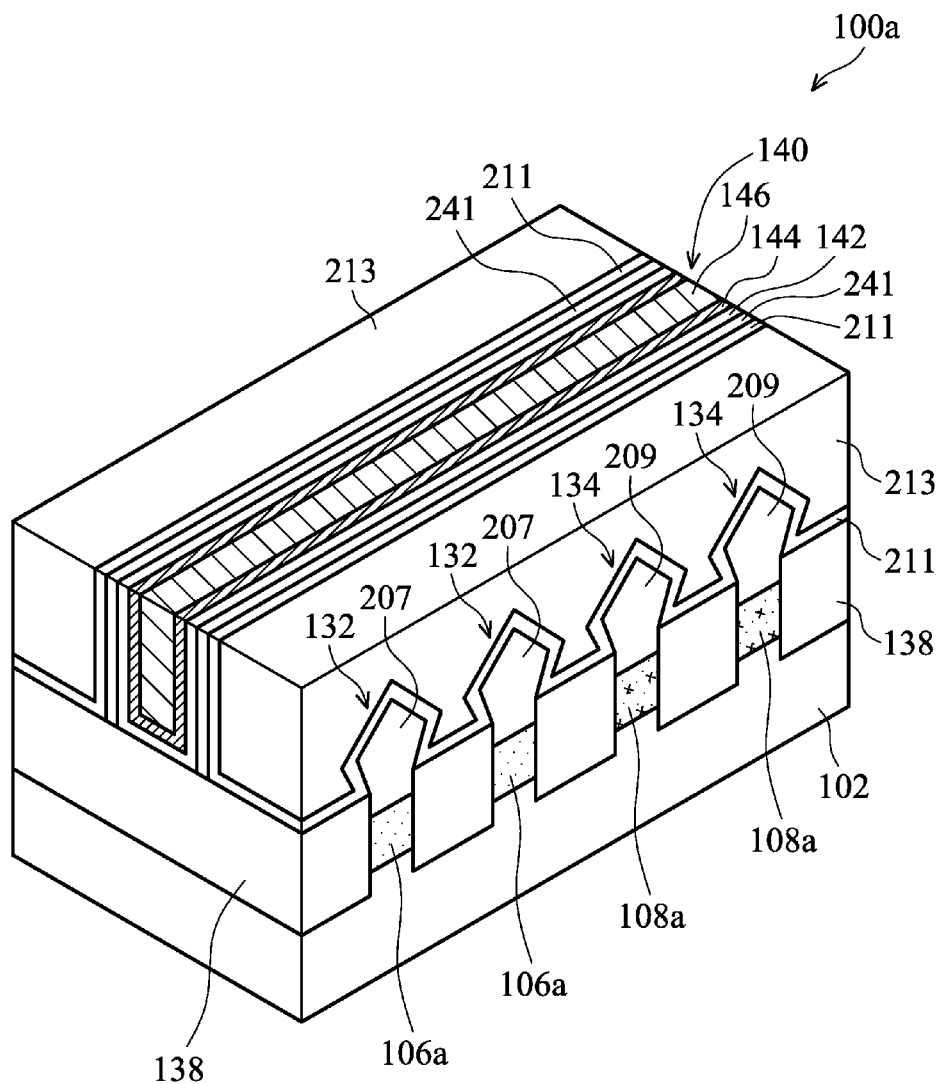
FIG. 2 is a perspective representation of a semiconductor structure formed by the processes shown in FIGS. 1A to 1K and described above in accordance with some embodiments.

FIG. 2 is a perspective representation of semiconductor structure 100a formed by the processes shown in FIGS. 1A to 1K and described above in accordance with some embodiments. As described above, semiconductor structure 100a includes first fin structures 132 and second fin structures 134 formed over substrate 102, and gate structure 140 is formed across first fin structures 132 and second fin structures 134. In addition, spacers 241 are formed on the sidewalls of gate structure 140 in accordance with some embodiments.

In some embodiments, spacers 241 are made of silicon nitride, silicon oxide, silicon oxynitride, silicon carbide, or other applicable dielectric materials. Spacers 241 may include a single layer or multiple layers.

Furthermore, first source/drain structures 207 are formed at two sides of first fin structures 132, and second source/drain structures 209 are formed at two sides of second fin structures 134 in accordance with some embodiments.

More specifically, first source/drain structures 207 and second source/drain structures 209 may be formed by forming recesses in two opposite sides of first fin structures 132 and second fin structure 134 and growing a strained material in the recesses by an epitaxial (epi) process. As shown in FIG. 2, in some embodiments, when the recesses are formed, first un-doped silicon structures 116a-1, second un-doped silicon structure 116a-2, and upper portions of first type of anti-punch through structure 106a and second type of anti-punch through structure 108a are removed. Accordingly, first source/drain structures 207 are directly formed on first type of anti-punch through structure 106a, and second source/drain structures 209 are directly formed on second type of anti-punch through structure 108a in accordance with some embodiments.

In some embodiments, the lattice constant of the strained material used to form first source/drain structures 207 and second source/drain structures 209 is different from the lattice constant of substrate 102. In some embodiments, first source/drain structures 207 and second source/drain structures 209 are made of Ge, SiGe, InAs, InGaAs, InSb, GaAs, GaSb, InAlP, InP, or the like.

In some embodiments, a contact etch stop layer (CESL) 211 and an inter-layer dielectric (ILD) layer 213 are formed over substrate 102 to cover first source/drain structures 207 and second source/drain structures 209, shallow trench isolation structures 138, and spacers 241, as shown in FIG. 2 in accordance with some embodiments.

In some embodiments, contact etch stop layer 211 is made of silicon nitride, silicon oxynitride, and/or other applicable materials. Contact etch stop layer 211 may be formed by plasma enhanced CVD, low pressure CVD, ALD, or other applicable processes.

Inter-layer dielectric layer 241 may include multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. Inter-layer dielectric layer 241 may be formed by chemical vapor deposition (CVD), physical vapor deposition, (PVD), atomic layer deposition (ALD), spin-on coating, or other applicable processes.

FIGS. 3A to 3E are cross-sectional representations of various stages of forming a semiconductor structure 100b in accordance with some embodiments. Semiconductor structure 100b is similar to semiconductor structure 100a described above, except a strain relax buffer layer 303 is formed over substrate 102. Accordingly, materials and methods used to form semiconductor structure 100b may be similar to, or the same as, those used to form semiconductor structure 100a and are not repeated herein.

Figure 3A:
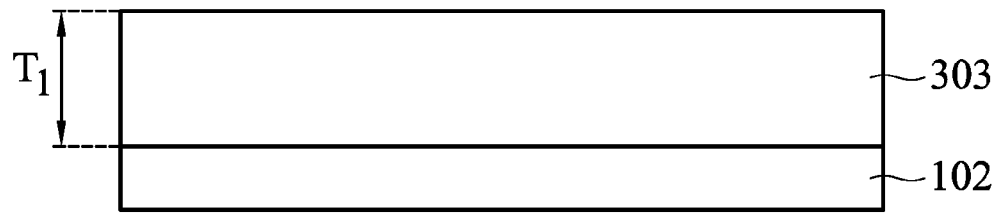
FIGS. 3A to 3E are cross-sectional representations of various stages of forming a semiconductor structure in accordance with some embodiments.
Figure 3B:
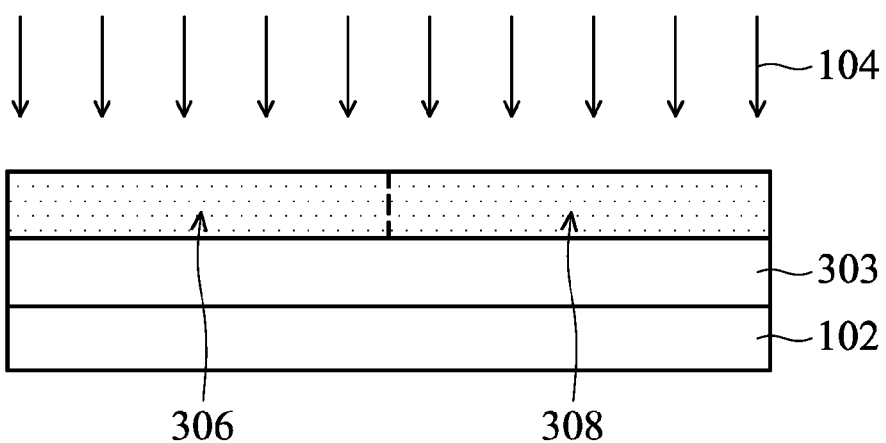

As shown in FIG. 3A, strain relax buffer layer 303 is formed over substrate 102 in accordance with some embodiments. In some embodiments, strain relax buffer layer 303 is made of SiGe. Strain relax buffer layer 303 may be formed by an epitaxial (epi) process. In some embodiments, strain relax buffer layer 303 has a thickness $T_1$ in a range from about 800 nm to about 1 µm.

After strain relax buffer layer 303 is formed, the processes shown in FIGS. 1A to 1K and described previously are performed to form semiconductor structure 100b. More specifically, first ion implantation process 104 is performed on strain relax buffer layer 303 to implant the first type of dopants in a first region 306 and a second region 308 of strain relax buffer layer 303 in accordance with some embodiments.

In some embodiments, the first type of dopants are implanted in strain relax buffer layer 303 to a depth in a range from about 5 nm to about 10 nm, which is measured from the top surface of strain relax buffer layer 303. If the first type of dopants are implanted to a position that is too deep (i.e. too far from the top surface of strain relax buffer layer 303), the resulting first type of anti-punch through structure may be formed away from the channel region of the fin structure, such that the effect of the anti-punch through structure may be undermined. On the other hand, if the first type of dopants are implanted to a position that is too shallow (i.e. too close to the top surface of strain relax buffer layer 303), the dopants in the first type of anti-punch through structure may enter the channel region of the fin structure in subsequent thermal processes, such that the electron mobility in the channel region may be affected.

Figure 3C:
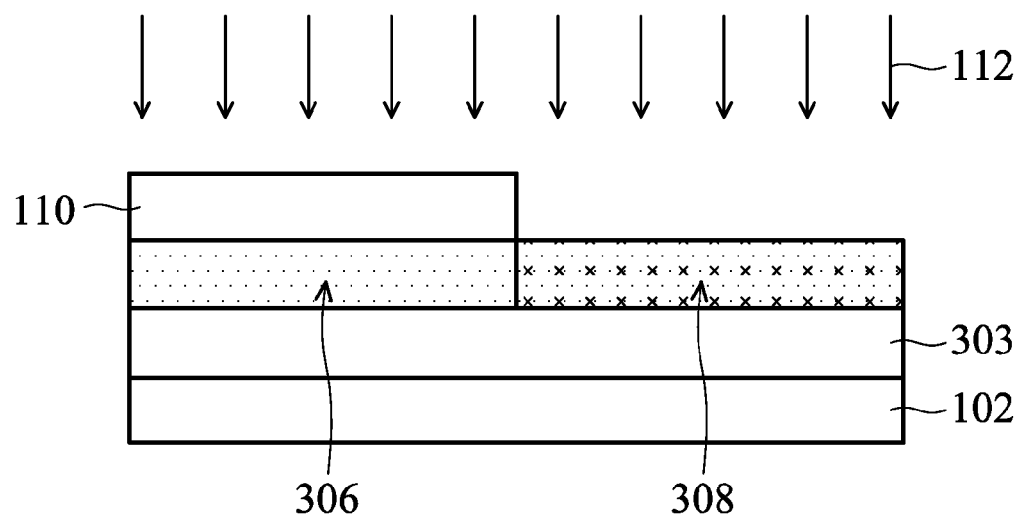

After the first type of dopants are implanted in first region 306 and second region 308 of strain relax buffer layer 303, photoresist layer 110 is formed over first region 306, such that first region 306 is covered by photoresist layer 110 while second region 308 is exposed, as shown in FIG. 3C in accordance with some embodiments.

After photoresist layer 110 is formed, the second type of dopants are implanted in the exposed second region 508 by second ion implantation process 112, and photoresist layer 110 is removed afterwards, as shown in FIG. 3C in accordance with some embodiments. In some embodiments, the second type of dopants are implanted in strain relax buffer layer 303 to a depth in a range from about 5 nm to about 10 nm. Similarly, if the second type of dopants are implanted to a position that is too deep, the resulting second type of anti-punch through structure may be formed away from the channel region of the fin structure, such that the effect of the anti-punch through structure may be undermined. On the other hand, if the second type of dopants are implanted to a position that is too shallow, the dopants in the second type of anti-punch through structure may enter the channel region of the fin structure in subsequent thermal processes, such that the electron mobility in the channel region may be affected.

Figure 3D:
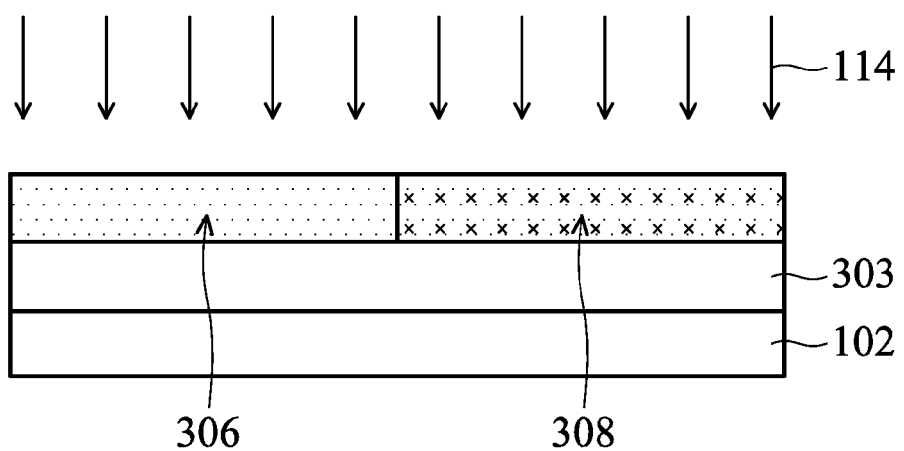

After the first type of dopants and the second type of dopants are both implanted in strain relax buffer layer 303, annealing process 114 is performed, as shown in FIG. 3D in accordance with some embodiments. During annealing process 114, the first type of dopants and the second type of dopants are annealed, such that the first type of dopants and the second type of dopants are redistributed in first region 106 and second region 108 of strain relax buffer layer 303.

After annealing process 114, the first type of dopants and the second type of dopants are redistributed, such that the dopants are concentrated at a depth in a range from about 10 nm to about 20 nm, which is measured from the top surface of strain relax buffer layer 303. The location of the dopants are designed to be close enough to the channel region of the structure formed in subsequent processes but not to be too close to effect the electron mobility in the channel region.

In some embodiments, annealing process 114 is performed at a temperature in a range from about 700° C. to about 1000° C. As described previously, annealing process 114 is performed at a relatively low temperature, and therefore strain relax buffer layer 303 will not be damaged due to annealing process 114. That is, if the annealing temperature is too high, the Ge in strain relax buffer layer 303 may be reflowed or migrated, resulting in strain relax buffer layer 303 being relaxed during annealing process 114. On the other hand, if the annealing temperature is not high enough, the dopants may not be fully activated and redistributed to their designated location.

As described previously, the first type of dopants and the second type of dopants may be different types of dopants. In addition, the doping concentration of the second type of dopants in second region 308 is substantially twice the doping concentration of the first type of dopants in second region 308 in accordance with some embodiments. Accordingly, the first type of dopants implanted in second region 308 during first ion implantation process 104 can be counterbalanced by the second type of dopants implanted during second ion implantation process 112. As a result, first region 306 can be seen as a first-type doping region, and second region 308 can be seen as a second type doping region.

Figure 3E:
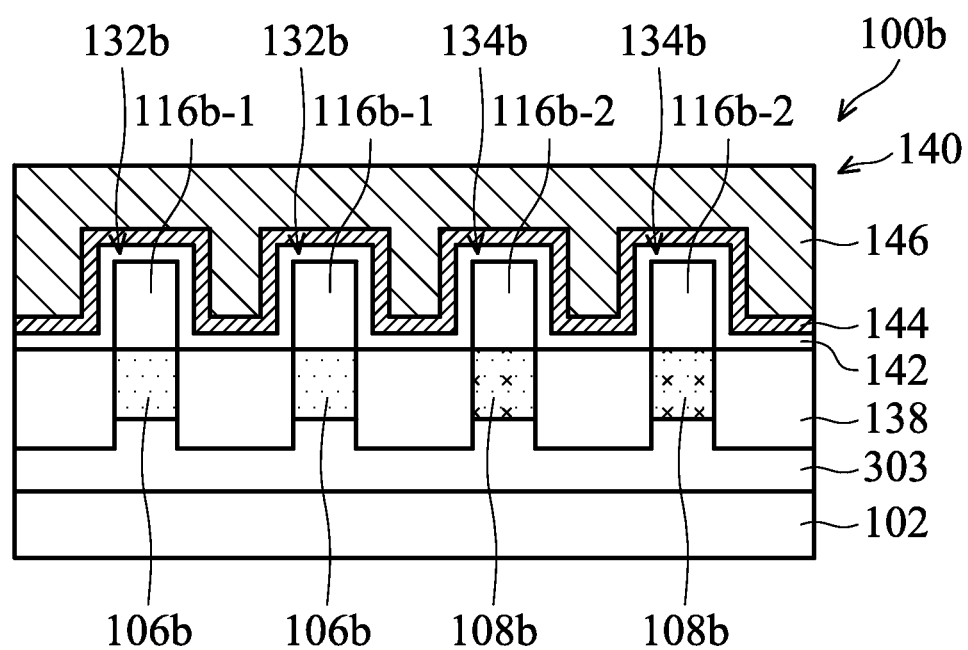

After the first-type of dopants and the second type of dopants are implanted in strain relax buffer layer 303 to form the first-type doping region in first region 306 and the second type doping region in second region 308, the processes shown in FIGS. 1D to 1K and described previously are performed to form semiconductor structure 100b, as shown in FIG. 3E in accordance with some embodiments.

More specifically, an un-doped silicon layer (e.g. un-doped silicon layer 116 shown in FIG. 1D) is formed over first region 306 and second region 308 of strain relax buffer layer 303 in accordance with some embodiments. Since the first type of dopants and the second type of dopants are implanted and annealed before the un-doped silicon layer is formed, the electron mobility of the channel region formed from the un-doped silicon layer may be improved.

Next, the un-doped silicon layer over first region 306 and first region 306 of strain relax buffer layer 303 are patterned to form first fin structures 132b, and the un-doped silicon layer over second region 308 and second region 308 of strain relax buffer layer 303 are patterned to form second fin structures 134b, as shown in FIG. 3E in accordance with some embodiments.

As shown in FIG. 3E, each first fin structure 132b includes a first type of anti-punch through structure 106b and a first un-doped silicon structure 116b-1 formed over first type of anti-punch through structure 106b in accordance with some embodiments. In addition, first type of anti-punch through structure 106b is formed by patterning first region 306 of strain relax buffer layer 303, and therefore first type of anti-punch through structure 106b is implanted with the first-type of dopants in accordance with some embodiments.

Similarly, each second fin structure 134b includes a second type of anti-punch through structure 108b and a second un-doped silicon structure 116b-2 formed over second type of anti-punch through structure 108b in accordance with some embodiments. In addition, second type of anti-punch through structure 108b is formed by patterning second region 108b of strain relax buffer layer 303, and therefore second type of anti-punch through structure 108b is implanted with the second-type of dopants in accordance with some embodiments.

After first fin structures 132b and second fin structure 134b are formed, shallow trench isolation (STI) structure 138 are formed around first fin structures 132b and second fin structure 134b, as shown in FIG. 3E in accordance with some embodiments. In some embodiments, the top surface of shallow trench isolation 138 is substantially level with the top surfaces of first-type anti-punch through structure 106b and second-type anti-punch through structure 108b. If the top surface of shallow trench isolation 138 is too much higher than the top surfaces of first-type anti-punch through structure 106b and second-type anti-punch through structure 108b, the channel with of first fin structures 132b and second fin structure 134b may be too small. On the other hand, if the top surface of shallow trench isolation 138 is too much lower than the top surfaces of first-type anti-punch through structure 106b and second-type anti-punch through structure 108b, the gate-control ability may be undermined.

After shallow trench isolation structure 138 is formed, gate structure 140 is formed across first fin structures 132b and second fin structure 134b, as shown in FIG. 3E in accordance with some embodiments. In some embodiments, gate structure 140 includes a gate dielectric layer 142, a work function metal layer 144, and a metal gate electrode layer 146.

As shown in FIG. 3E, first un-doped silicon structures 116b-1 and second un-doped silicon structure 116b-2 are covered by gate structure 140 and are configure to be the channel regions of semiconductor structure 100b. In addition, first type of anti-punch through structure 106b and second type of anti-punch through structure 108b are self-aligned to the channel regions without using a complicated aligning process.

FIGS. 4A to 4D are cross-sectional representations of various stages of forming a semiconductor structure 100c in accordance with some embodiments. Semiconductor structure 100c is similar to semiconductor structure 100b described above, except the first-type of dopants are implanted in a first region 406 but not in a second region 408. Materials and methods used to form semiconductor structure 100c may be similar to, or the same as, those used to form semiconductor structures 100a and 100b and are not repeated herein.

Figure 4A:
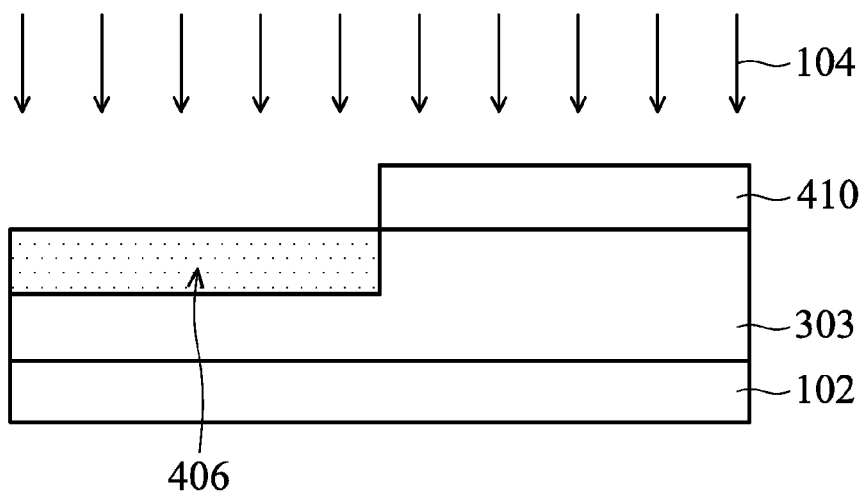
FIGS. 4A to 4D are cross-sectional representations of various stages of forming a semiconductor structure in accordance with some embodiments.

As shown in FIG. 4A, strain relax buffer layer 303 is formed over substrate 102 in accordance with some embodiments. After strain relax buffer layer 303 is formed, a photoresist layer 410 is formed over first region 406 of strain relax buffer layer 303, and first ion implantation process 104 is performed to strain relax buffer layer 303 to implant the first type of dopants in first region 406 of strain relax buffer layer 303 in accordance with some embodiments. It should be noted that, in these embodiments, the first-type of dopants are not implanted in second region 408 of strain relax buffer layer 303.

Figure 4B:
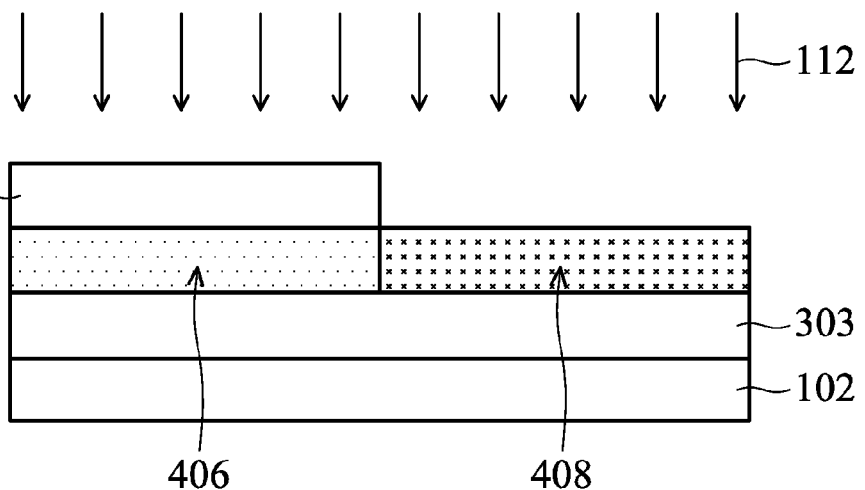

After the first type of dopants are implanted in first region 406 of strain relax buffer layer 303, photoresist layer 110 is formed over first region 406, such that first region 406 is covered by photoresist layer 110 while second region 408 is exposed, as shown in FIG. 4B in accordance with some embodiments.

After photoresist layer 110 is formed, the second type of dopants are implanted in the exposed second region 408, and photoresist layer 110 is removed afterwards, as shown in FIG. 4B in accordance with some embodiments. In some embodiments, second ion implantation process 112 is performed to implant the second type of dopants into second region 408 of strain relax buffer layer 303.

Figure 4C:
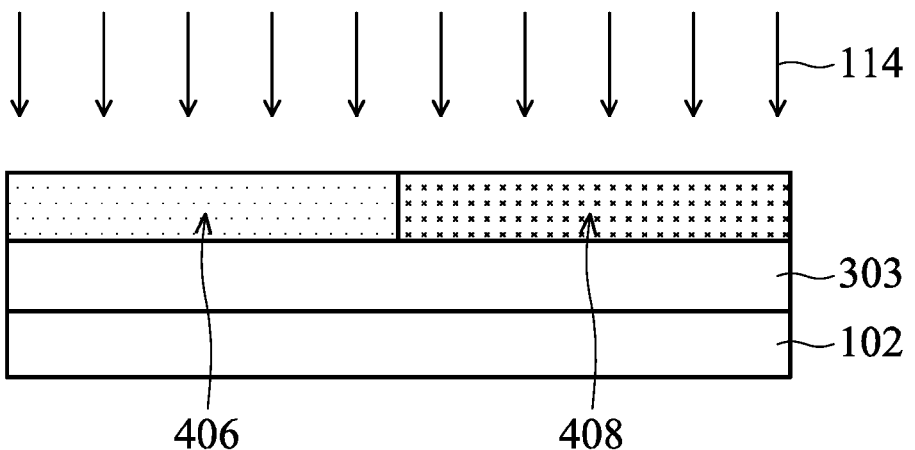

After the first type of dopants and the second type of dopants are both implanted in strain relax buffer layer 303, annealing process 114 is performed, as shown in FIG. 4C in accordance with some embodiments. During annealing process 114, the first type of dopants and the second type of dopants are activated, such that the first type of dopants and the second type of dopants are redistributed in first region 406 and second region 408 of strain relax buffer layer 303.

The first type of dopants and the second type of dopants may be different types of dopants. In some embodiments, the doping concentration of the second type of dopants in second region 408 is substantially equal to the doping concentration of the first type of dopants in first region 406. In addition, first region 406 can be seen as a first-type doping region, and second region 408 can be seen as a second type doping region.

Figure 4D:
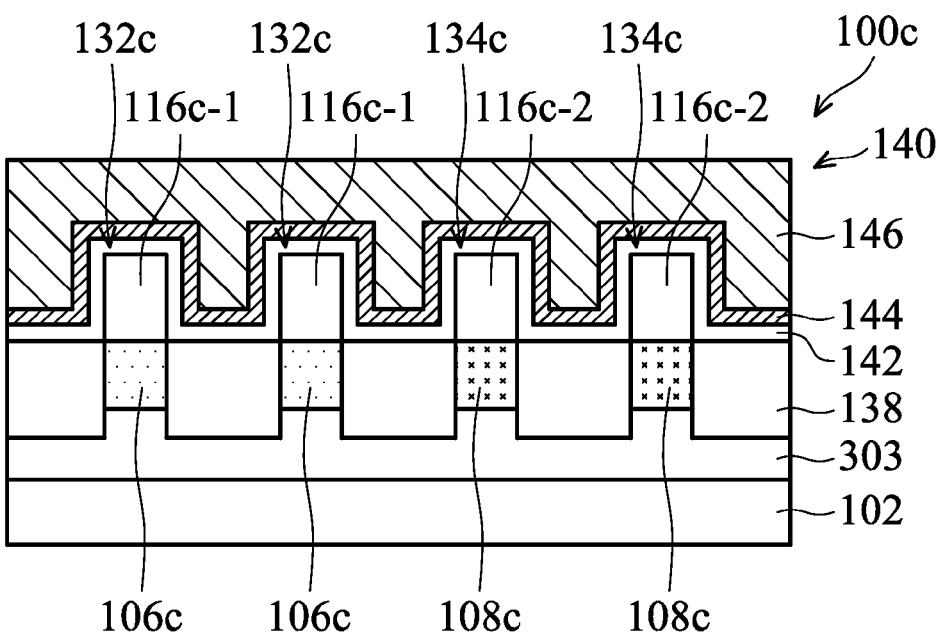

After the first-type of dopants and the second type of dopants are implanted and annealed in strain relax buffer layer 303 to form the first-type doping region in first region 306 and the type doping region in second region 308, the processes shown in FIGS. 1D to 1K and described previously are performed to form semiconductor structure 100c, as shown in FIG. 4D in accordance with some embodiments.

More specifically, an un-doped silicon layer (e.g. un-doped silicon layer 116 shown in FIG. 1D) is formed over first region 406 and second region 408 of strain relax buffer layer 303, and the un-doped silicon layer and strain relax buffer layer 303 are patterned to form first fin structures 132c and second fin structures 134c, as shown in FIG. 4D in accordance with some embodiments.

As shown in FIG. 4D, each first fin structure 132c includes a first type of anti-punch through structure 106c and a first un-doped silicon structure 116c-1 formed over first type of anti-punch through structure 106c in accordance with some embodiments. In addition, first type of anti-punch through structure 106c is formed by patterning first region 406 of strain relax buffer layer 303, and therefore first type of anti-punch through structure 106c has the first-type of dopants implanted therein in accordance with some embodiments.

Similarly, each second fin structure 134c includes a second type of anti-punch through structure 108c and a second un-doped silicon structure 116c-2 formed over second type of anti-punch through structure 108c in accordance with some embodiments. In addition, second type of anti-punch through structure 108c is formed by patterning second region 108c of strain relax buffer layer 303, and therefore second type of anti-punch through structure 108c is implanted with the second-type of dopants in accordance with some embodiments.

After first fin structures 132c and second fin structure 134c are formed, shallow trench isolation (STI) structure 138 are formed around first fin structures 132c and second fin structure 134c, as shown in FIG. 4D in accordance with some embodiments. In some embodiments, the top surface of shallow trench isolation 138 is substantially level with the top surfaces of first-type anti-punch through structure 106c and second-type anti-punch through structure 108c.

After shallow trench isolation structure 138 is formed, gate structure 140 is formed across first fin structures 132c and second fin structure 134c, as shown in FIG. 4D in accordance with some embodiments. In some embodiments, gate structure 140 includes a gate dielectric layer 142, a work function metal layer 144, and a metal gate electrode layer 146.

As shown in FIG. 4D, first un-doped silicon structures 116c-1 and second un-doped silicon structure 116c-2 are covered by gate structure 140 and are configured to be the channel regions of semiconductor structure 100c. In addition, first type of anti-punch through structure 106c and second type of anti-punch through structure 108c are self-aligned to the channel regions without using complicated aligning processes.

As described previously, the anti-punch through structures (e.g. first anti-punch through structures 106a, 106b and 106c, and second anti-punch through structures 108a, 108b, and 108c) are formed below the channel region of fin structures (e.g. first fin structures 132, 132a, and 132b and second fin structures 134, 134b, and 134c). The anti-punch through structures formed below the fin structures can help the gate structure (e.g. gate structure 140) formed over the fin structure to have a better control over the semiconductor structure.

However, if anti-punch through structures are formed by implanting through the fin structure, the dopants in the channel region may result in the reduction of mobility in the channel region, and the alignment for implanting the anti-punch through structures and the fin structure may also be challenging. Therefore, in some embodiments of the disclosure, the first type of dopants and the second type of dopants are implanted and annealed before the fin structures are formed. Since the dopants are annealed before un-doped silicon layer 116, which is used to form the channel region of the fin structure afterwards, is formed, the dopants are only redistributed in substrate 102 or strain relax buffer layer 303 but not in un-doped silicon layer 116. Accordingly, the dopants in the anti-punch through structures will not be driven into the channel region of the fin structure during annealing process 114, and the channel ability of the fin structures are therefore improved.

In some embodiments, the electron mobility gain of the fin structure is in a range from about 5% to about 15%, compared to the fin structure having anti-punch through structure formed by implanting through the fin structure. The improvement of the electron mobility may be because of reducing the scattering caused by the dopants in the channel region in accordance with some embodiments.

In addition, the doped regions (e.g. first region 106, 306, and 406 and second region 108, 308, and 408) and un-doped silicon layer 116 are patterned in the same etching process. Therefore, the resulting anti-punch through structures are self-aligned to the channel region, and no complicated aligning processes are required.

In some embodiments, strain relax buffer layer 303 is formed. The formation of strain relax buffer layer 303 may improve the performance of the semiconductor structures. However, if strain relax buffer layer 303 is heated under a temperature that is too high, the strain of strain relax buffer layer 303 may be relaxed. Therefore, annealing process 114 for activated the first type of dopants and the second type of dopants may be performed under a relatively low temperature to prevent the relaxation of the strain.

Furthermore, in some embodiments, the first type of dopants are first implanted in both first regions and second regions, and the second type of dopants are implanted in the second regions with a concentration higher than that of the first type of dopants. Therefore, the first type of dopants implanted in the second region during first ion implantation process 104 can be counterbalanced by the second type of dopants implanted during second ion implantation process 112. Accordingly, fewer masking processes are required, and the cost of manufacturing the semiconductor structures is reduced.

Embodiments of forming semiconductor structures are provided. The method includes implanting the first type of dopants and the second type of dopants in a substrate to form a first type of doping region and a second type of doping region. Next, an un-doped silicon layer is formed over the doped substrate, and the un-doped silicon layer and the doped substrate are patterned to form a first fin structure and a second fin structure. The first fin structure includes a first type of anti-punch through structure formed below its channel region and the second fin structure includes a second type of anti-punch structure formed below its channel region. Since the first type of anti-punch structure and the second type of anti-punch structure are doped before the fin structure is formed, the electron mobility of the channel regions is improved.

In some embodiments, a method for manufacturing a semiconductor structure is provided. The method for manufacturing a semiconductor structure includes implanting a first type of dopants in a first region and a second region of a substrate and implanting a second type of dopants in the second region of the substrate. The method further includes forming an un-doped silicon layer over the first region and the second region of the substrate and patterning the un-doped silicon layer, the first region of the substrate, and the second region of the substrate to form a first fin structure and a second fin structure. The method further includes forming a shallow trench isolation structure around the first fin structure and the second fin structure. The method further includes forming a gate structure across the first fin structure and the second fin structure. In addition, the first fin structure comprises a first type of anti-punch through structure implanted with the first type of dopants and a first un-doped silicon structure over the first type of anti-punch through structure, and the second fin structure comprises a second type of anti-punch through structure implanted with the second type of dopants and a second un-doped silicon structure formed over the second type of anti-punch through structure.

In some embodiments, a method for manufacturing a semiconductor structure is provided. The method For manufacturing a semiconductor structure includes forming a strain relax buffer layer over a substrate and implanting a first type of dopants in a first region of the strain relax buffer layer. The method further includes implanting a second type of dopants in the second region of the strain relax buffer layer and forming an un-doped silicon layer over the first region and the second region of the strain relax buffer layer. The method further includes patterning the un-doped silicon layer, the first region of the strain relax buffer layer, and the second region of the strain relax buffer layer to form a first fin structure and a second fin structure. The method further includes forming a shallow trench isolation structure around the first fin structure and the second fin structure and forming a gate structure across the first fin structure and the second fin structure. In addition, the first fin structure comprises a first type of anti-punch through structure implanted with the first type of dopants and a first un-doped silicon structure over the first type of anti-punch through structure, and the second fin structure comprises a second type of anti-punch through structure implanted with the second type of dopants and a second un-doped silicon structure formed over the second type of anti-punch through structure.

In some embodiments, a method for manufacturing a semiconductor structure is provided. The method for manufacturing a semiconductor structure includes forming a strain relax buffer layer over a substrate and implanting a first type of dopants in a first region and a second region of the strain relax buffer layer. The method further includes implanting a second type of dopants in the second region of the strain relax buffer layer and forming an un-doped silicon layer over the first region and the second region of the strain relax buffer layer. The method further includes patterning the un-doped silicon layer, the first region of the strain relax buffer layer, and the second region of the strain relax buffer layer to form a first fin structure and a second fin structure. The method further includes forming a shallow trench isolation structure around the first fin structure and the second fin structure and forming a gate structure across the first fin structure and the second fin structure. In addition, the first fin structure comprises a first type of anti-punch through structure implanted with the first type of dopants and a first un-doped silicon structure over the first type of anti-punch through structure, and the second fin structure comprises a second type of anti-punch through structure implanted with the second type of dopants and a second un-doped silicon structure formed over the second type of anti-punch through structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   implanting a first type of dopants in a first region and a second region of a substrate;
   implanting a second type of dopants in the second region of the substrate;
   forming an un-doped silicon layer over the first region and the second region of the substrate;
   patterning the un-doped silicon layer, the first region of the substrate, and the second region of the substrate to form a first fin structure and a second fin structure;
   forming a shallow trench isolation structure around the first fin structure and the second fin structure; and
   forming a gate structure across the first fin structure and the second fin structure,
   wherein the first fin structure comprises a first type of anti-punch through structure implanted with the first type of dopants and a first un-doped silicon structure over the first type of anti-punch through structure, and the second fin structure comprises a second type of anti-punch through structure implanted with the second type of dopants and a second un-doped silicon structure formed over the second type of anti-punch through structure.

2. The method for manufacturing a semiconductor structure as claimed in claim 1, wherein the un-doped silicon layer is formed by an epitaxial (epi) process.

3. The method for manufacturing a semiconductor structure as claimed in claim 1, wherein a thickness of the un-doped silicon layer is in a range from about 30 nm to about 60 nm.

4. The method for manufacturing a semiconductor structure as claimed in claim 1, wherein a doping concentration of the second type of dopants implanted in the second region is substantially twice of a doping concentration of the first type of dopants implanted in the second region.

5. The method for manufacturing a semiconductor structure as claimed in claim 1, wherein a thickness of the first type of anti-punch through structure is in a range from about 10 nm to about 20 nm.

6. The method for manufacturing a semiconductor structure as claimed in claim 1, wherein a top surface of the shallow trench isolation structure is substantially level with a top surface of the first type of anti-punch through structure.

7. The method for manufacturing a semiconductor structure as claimed in claim 1, wherein the step of patterning the un-doped silicon layer, the first region of the substrate, and the second region of the substrate further comprises:
    forming a first polysilicon structure over the un-doped silicon layer over the first region of the substrate and a second polysilicon structure over the un-doped silicon layer over the second region of the substrate;
    forming first spacers on sidewalls of the first polysilicon structure and second spacers on sidewalls of the second polysilicon structure;
    removing the first polysilicon structure and the second polysilicon structure;
    etching the un-doped silicon layer to form the first fin structures and the second fin structure; and
    removing the first spacers and the second spacers,
    wherein the first spacers and the second spacers are used as masks when the un-doped silicon layer is etched.

8. The method for manufacturing a semiconductor structure as claimed in claim 1, further comprising:
    annealing the first type of dopants and the second type of dopants before the un-doped silicon layer is formed, such that the first type of dopants and the second type of dopants are redistributed in the substrate but not in the un-doped silicon layer.

9. A method for manufacturing a semiconductor structure, comprising:
    forming a strain relax buffer layer over a substrate;
    implanting a first type of dopants in a first region of the strain relax buffer layer;
    implanting a second type of dopants in the second region of the strain relax buffer layer;
    forming an un-doped silicon layer over the first region and the second region of the strain relax buffer layer;
    patterning the un-doped silicon layer, the first region of the strain relax buffer layer, and the second region of the strain relax buffer layer to form a first fin structure and a second fin structure;
    forming a shallow trench isolation structure around the first fin structure and the second fin structure; and
    forming a gate structure across the first fin structure and the second fin structure,
    wherein the first fin structure comprises a first type of anti-punch through structure implanted with the first type of dopants and a first un-doped silicon structure over the first type of anti-punch through structure, and the second fin structure comprises a second type of anti-punch through structure implanted with the second type of dopants and a second un-doped silicon structure formed over the second type of anti-punch through structure.

10. The method for manufacturing a semiconductor structure as claimed in claim 9, further comprising:
    annealing the first type of dopants and the second type of dopants before the un-doped silicon layer is formed, such that the first type of dopants and the second type of dopants are redistributed in the strain relax buffer layer but not in the un-doped silicon layer.

11. The method for manufacturing a semiconductor structure as claimed in claim 10, wherein the first type of dopants and the second type of dopants are annealed at a temperature in a range from about 700° C. to about 1000° C.

12. The method for manufacturing a semiconductor structure as claimed in claim 9, wherein a thickness of the strain relax buffer layer is in a range from about 80 nm to about 1 μm.

13. The method for manufacturing a semiconductor structure as claimed in claim 9, wherein the un-doped silicon layer is formed by an epitaxial (epi) process.

14. The method for manufacturing a semiconductor structure as claimed in claim 9, wherein a top surface of the shallow trench isolation structure is substantially level with a top surface of the first type of anti-punch through structure.

15. A method for manufacturing a semiconductor structure, comprising:
    forming a strain relax buffer layer over a substrate;
    implanting a first type of dopants in a first region and a second region of the strain relax buffer layer;
    implanting a second type of dopants in the second region of the strain relax buffer layer;
    forming an un-doped silicon layer over the first region and the second region of the strain relax buffer layer;
    patterning the un-doped silicon layer, the first region of the strain relax buffer layer, and the second region of the strain relax buffer layer to form a first fin structure and a second fin structure;
    forming a shallow trench isolation structure around the first fin structure and the second fin structure; and
    forming a gate structure across the first fin structure and the second fin structure,
    wherein the first fin structure comprises a first type of anti-punch through structure implanted with the first type of dopants and a first un-doped silicon structure over the first type of anti-punch through structure, and the second fin structure comprises a second type of anti-punch through structure implanted with the second type of dopants and a second un-doped silicon structure formed over the second type of anti-punch through structure.

16. The method for manufacturing a semiconductor structure as claimed in claim 15, further comprising:
    annealing the first type of dopants and the second type of dopants before the un-doped silicon layer is formed, such that the first type of dopants and the second type of dopants are redistributed in the strain relax buffer layer but not in the un-doped silicon layer.

17. The method for manufacturing a semiconductor structure as claimed in claim 16, wherein the first type of dopants and the second type of dopants are annealed at a temperature in a range from about 700° C. to about 1000° C.

18. The method for manufacturing a semiconductor structure as claimed in claim 16, wherein a doping concentration of the second type of dopants implanted in the second region is substantially twice of a doping concentration of the first type of dopants implanted in the second region.

19. The method for manufacturing a semiconductor structure as claimed in claim 16, wherein the un-doped silicon layer is formed by an epitaxial (epi) process.

20. The method for manufacturing a semiconductor structure as claimed in claim 16, wherein a top surface of the shallow trench isolation structure is substantially level with a top surface of the first type of anti-punch through structure.

* * * * *